United States Patent [19]

Ishii

[11] 4,219,778
[45] Aug. 26, 1980

[54] SIGNAL PROCESSING CIRCUIT FOR AN FM SIGNAL RECEIVER

[75] Inventor: Eiichi Ishii, Tokyo, Japan

[73] Assignee: Nippon Electric Co., Ltd., Tokyo, Japan

[21] Appl. No.: 14,013

[22] Filed: Feb. 21, 1979

[30] Foreign Application Priority Data

Feb. 20, 1978 [JP] Japan .................................. 53-18887

[51] Int. Cl.² .............................................. H04B 1/16
[52] U.S. Cl. ................................... 455/205; 455/155; 455/212; 455/226
[58] Field of Search ............... 325/344, 348, 349, 363, 325/364, 398, 455; 334/30; 340/185, 188 CH, 789

[56] References Cited

U.S. PATENT DOCUMENTS

| | | | |
|---|---|---|---|
| 3,696,301 | 10/1972 | Hoshi | 325/455 |
| 3,866,125 | 2/1975 | Kilian | 325/348 |
| 4,059,802 | 11/1977 | Ohsawa et al. | 325/455 |
| 4,143,331 | 3/1979 | Page | 325/398 |

Primary Examiner—Robert L. Griffin
Assistant Examiner—Tommy P. Chin
Attorney, Agent, or Firm—Sughrue, Rothwell, Mion, Zinn and Macpeak

[57] ABSTRACT

A signal processing circuit for an FM signal receiver suitable for constructing in an integrated circuit is disclosed. The signal processing circuit comprises a differential amplifier circuit receiving first and second demodulated signals of the frequency modulated signal and providing first and second output signals. A current switching circuit has a first input point for receiving the second output signal of the amplifier and a second input point for receiving the output of a constant current source. The current switching circuit switches current paths from the first and second input points to first and second output points in response switching control inputs. A first current mirror has an input point coupled to the second output point of the current switching circuit and an output point coupled to the first output signal of the amplifier circuit. A second current mirror has an input point coupled to the first output point of the current switching circuit, a first output point coupled to the output point of the first current mirror and a second output point coupled to an output terminal. A null-centered indicator is connected between a reference voltage terminal and the junction of the output point of the first current mirror and the first output point of the second current mirror. A potential difference detector can be inserted between the reference voltage terminal and the null-centered indicator.

7 Claims, 3 Drawing Figures

SIGNAL PROCESSING CIRCUIT FOR AN FM SIGNAL RECEIVER

BACKGROUND OF THE INVENTION

The present invention relates to a signal processing circuit for FM signal receiver, and more particularly to a combined circuit of a tuning level indication, a muting operation and an AFC (Auto Frequency Control) signal information.

In addition to the fundamental construction for receiving an FM signal, such as a tunner, a radio-frequency (RF) amplifier, a mixer, an intermediate-frequency (IF) amplifier, an FM demodulator, an audio-frequency (AF) and power amplifiers, and a loud speaker, recently FM radio receivers generally provide a tuning indicator for aiding a listener to select a broadcasting station, a level muting function which attenuates or interrupts an output when there is no received signal or when a received signal level is so low that good receiving characteristics cannot be obtained, a band muting function which attenuates or interrupts an output when precise tuning to a receiving signal frequency is not attained and hence a good demodulated output cannot be obtained, and/or an AFC function which automatically reduces variation of an oscillation frequency of a local oscillator due to variations of an environmental temperature and a power supply voltage. Consequently, an FM receiver requires many circuits for achieving the associated functions such as a drive circuit for a tuning indicator, a signal strength detector circuit, a frequency deviation detector circuit for detecting whether tuning is made precisely or not, a muting control circuit responsive to the outputs of the signal strength detector circuit and the frequency deviation detector circuit, for controlling a muting operation of the receiver, an output control circuit responsive to the output of the muting control circuit for deriving the output of the FM receiver or cutting off the output by attenuating or interrupting the output under the action of muting, an AFC signal deriving circuit, etc.

In the conventional FM radio receiver, the signal strength was detected from IF amplifier stage and indicated by an indicator such as moving coil type ammeter, as taught in U.S. Pat. No. 3,673,499. The listener could detect the precise tuning condition from the indication of the signal strength indicator. The muting operation was made by the peak-to-peak detection output from the angle modulation detector, and AFC operation by the output derived from the output amplifier, as taught in U.S. Pat. No. 3,714,583. Thus, each operation was made by the individual circuit associated to the individual fundamental circuit block, and so the conventional FM radio receiver had a disadvantage that its construction was extremely complex.

SUMMARY OF THE INVENTION

Therefore, it is one object of the present invention to provide a signal processing circuit for use in an FM signal receiver which has a simple circuit construction.

Another object of the present invention is to provide the above-described signal processing circuit which is suitable for constructing in an integrated circuit.

According to the present invention, there is provided a signal processing circuit comprising an amplifier circuit for providing an amplified signal, a current switching circuit selecting a current flowing path for an amplified signal flowing from the amplifier and a constant current signal from a constant current source and controlled by a muting signal, current mirrors receiving signals from the current switching signal and producing an output current proportional to the received signals from the selected current path from the switching circuit, a reference voltage terminal coupled to a bias voltage, a coupling point to the output of one of the current mirrors and an output of the amplifier circuit, and a tuning indicator positioned between the reference voltage terminal and the coupling point.

The present invention can provide a signal processing circuit having an audio frequency amplifier circuit, a tuning indicator drive circuit, a tuning frequency deviation detector circuit, an AFC signal output circuit and an audio signal switching circuit for muting which can be constructed in a single circuit block with a simple circuit construction that is free from the above-described disadvantage. Also, the signal processing circuit according to the present invention is suitable for constructing in an integrated circuit.

BRIEF DESCRIPTION OF THE DRAWINGS

The above and further objects, features and advantages of the present invention will become more apparent from the following detailed description of embodiments taken in conjunction with the accompanying drawings, wherein.

DESCRIPTION OF THE PREFERRED EMBODIMENTS

Figure 1:
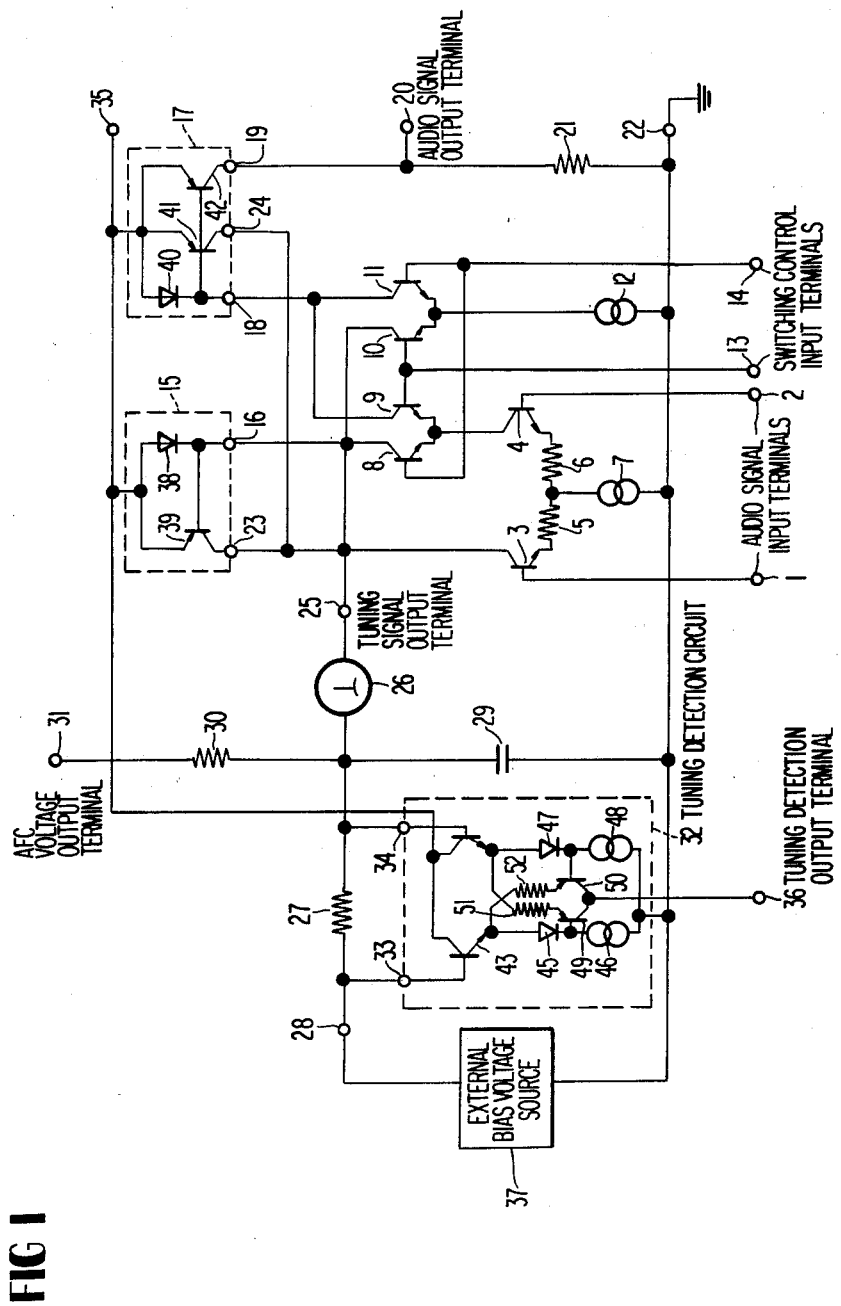
FIG. 1 is a circuit diagram showing one preferred embodiment of the signal processing circuit according to the present invention.

Referring now to FIG. 1, all the circuit components of one preferred embodiment according to the present invention are formed on a single semiconductor chip, except for a null-centered tuning indicator 26, resistors 27 and 30, and a capacitor 29. The semiconductor chip has a power supply terminal 35, a ground terminal 22, first and second audio signal input terminals 1 and 2, first and second switching control input terminals 13 and 14, an audio signal output terminal 20, a tuning signal output terminal 25, a tuning detection output terminal 36, and terminals 33 and 34. It can be designed to supply a bias voltage from an external bias voltage source 37 through a terminal 28. A first audio signal input terminal 1 and a second audio signal input terminal 2 are connected respectively to a base of a transistor 3 and a base of another transistor 4, and the emitters of the transistors 3 and 4 are connected in common to a constant current source 7 through resistors 5 and 6, respectively. The collector of the transistor 4 is connected to the emitters of the transistors 8 and 9 which have their emitters connected in common. In addition, there are provided another pair of transistors 10 and 11 having their emitters connected in common, and a current switching circuit is composed of these transistors 8, 9, 10 and 11. The common emitters of the transistors 10 and 11 are connected to constant current source 12, and the current value supplied from this constant current source 12 is equal to one-half of the current value supplied from the constant current source 7. The bases of the transistors 9 and 10 are connected in common to a first switching control input terminal 13, while the bases of the transistors 8 and 11 are connected in common to a second switching control input terminal 14. The collectors of the transistors 8 and 10 are connected in common to an input point 16 of a current mirror circuit 15. Also, the collectors of the transistors 9 and 11 are connected in common to an input point 18 of another current mirror circuit 17. The first output point 19 of this current mirror circuit 17 is connected to an audio signal output terminal 20, and is also connected via a load resistor 21 to a ground terminal 22. The output point 23 of the current mirror circuit 15 and the second output point 24 of the current mirror circuit 17 are connected in common to the collector of the transistor 3, and are further connected to a tuning signal output terminal 25.

The tuning signal output terminal 25 is connected through a null-centered tuning indicator 26 and a resistor 27 to a bias terminal 28. The junction between the null-centered tuning indicator 26 and the resistor 27 is connected to the ground terminal 22 via a capacitor 29, and is connected to an AFC voltage supply terminal 31 via a resistor 30. The opposite ends of the resistor 27 are respectively connected to first and second detector terminals 33 and 34 of a potential difference detector circuit 32. In addition, reference numeral 35 designates a power supply terminal, numeral 36 an output terminal of the tuning detection circuit, and numeral 37 a bias voltage source.

The term "current mirror circuit" as used throughout this specification implies a circuit which detects a current flowing through an input point and which makes an output current proportional to the input current to be derived from an output point, and it can be constructed by employing a diode 38 and a transistor 39, connecting a junction between one terminal of the diode 38 and the emitter of the transistor 39 to the power supply terminal 38, using the junction between the other terminal of the diode 38 and the base of the transistor 39 as the input point 16 of the current mirror circuit 15, using the collector of the transistor 39 as the output point 23 of the same current mirror circuit 15, and detecting the current flowing through the diode 38 by means of the transistor 39, as is the case with the current mirror circuit 15 shown in FIG. 1. The current ratio of the input and output currents is determined by the PN junction area ratio of that of diode 38 and the base-emitter junction of transistor 39.

The other current mirror circuit 17 is likewise constructed by means of a diode 40 and transistors 41 and 42, which are matched to each other. The output current at the output point 19 is determined by the PN junction area ratio of that of diode 40 and base-emitter junction of transistor 42, and the output current at the output point 24 by the PN junction area ratio of that of diode 40 and base-emitter junction of transistor 41.

The tuning detection circuit 32 operates so as to detect the absolute value of the difference between the terminal potentials at the first and second detector terminals 33 and 34, and for instance, it is illustrated as encircled by a dotted line in FIG. 1. More particularly, there are provided a transistor 43 and a transistor 44 having their collectors connected in common, the common collectors are connected to the power supply terminal 35, the respective bases of these transistors 43 and 44 are connected to the first and second terminals 33 and 34, respectively, and the emitter of the transistor 43 is connected via a diode 45 to a current source 46, while the emitter of the transistor 44 is connected via a diode 47 to another current source 48. There are provided additional transistors 49 and 50 of different conductivity type from the transistors 43 and 44, the base of the transistor 49 is connected to the junction between the diode 45 and the current source 46, and the emitter of the transistor 49 is connected via a resistor 51 to the emitter of the transistor 44, while the base of the transistor 50 is connected to the junction between the diode 47 and the current source 48, and the emitter of the transistor 50 is connected via a resistor 52 to the emitter of the transistor 43, and the collectors of the transistor 49 and 50 are connected in common to be used as an output terminal 36 of the tuning detection circuit 32.

To the first and second audio signal input terminals 1 and 2 are respectively applied demodulated audio frequency signals which have inverted phases each other, superposed on D.C. bias voltages and which are fed from a FM demodulator stage. Otherwise, to one input terminal is applied a demodulated output signal superposed on a D.C. bias voltage, and to the other input terminal is applied a D.C. bias voltage.

If the FM receiver is precisely tuned to a center frequency of a receiving signal, then D.C. components of the input signals applied to the first and second signal input terminals 1 and 2 are equal to each other.

The input voltages at the first and second input terminals 13 and 14 are controlled by a muting control circuit (not shown). The muting control circuit produces a control signal when no signal or a weak signal is received or when precise tuning is not attained. In the case where an output is derived from the FM receiver without muting, the output voltage on the first current switching control signal input terminal 13 is made sufficiently higher than the input voltage on the second current switching control signal input terminal 14, and thereby the transistors 8 and 11 are cut off, while the transistors 9 and 10 are made conducting. An input signal applied between the first and second signal input terminals 1 and 2 is amplified by the transistors 3 and 4, the amplified signal is applied from the collector of the transistor 4 via the transistor 9 to the input point 18 of the current mirror circuit 17, and an amplified signal is derived from the first output point 19 of the current mirror circuit 17 and is transferred to an output terminal 20. From the second output point 24 of the current mirror circuit 17 is derived a current equal to one-half of the current flowing through the input point 18. This operation can be achieved by making the PN junction area of the transistor 42 half of the PN junction area of the diode 40. On the other hand, a current supplied from the current source 12 is applied via the transistor 10 to the input point 16 of the current mirror circuit 15. From the output point 23 of the current mirror circuit 15 is derived a current equal to one-half of the current flowing through the input point 16 from the current source 12.

Assuming now that the FM receiver is precisely tuned to the received signal frequency and hence the D.C. components of the input voltages of the first and second audio signal input terminals 1 and 2 are equal to each other, then the D.C. components of the currents flowing through the transistors 3 and 4 are equal to each other, and they are equal to the current value supplied from the current source 12. Since the ratio of the current flowing through the input point 16 of the current mirror circuit 15 to the current flowing through the output point 23 is selected at $1:\frac{1}{2}$, and since the ratio of the current flowing through the input point 18 of the current mirror circuit 17 to the current flowing through the second output point 24 is selected at 1:½, the D.C. component of the sum of the current flowing through the output point 23 of the current mirror circuit 15 and the current flowing through the second output point 24 of the current mirror circuit 17 and the D.C. component of the current flowing through the transistor 3 become equal to each other and are balanced, and hence the current flowing through the null-centered tuning indicator 26 contains no D.C. component. The null-centered tuning indicator 26 is composed of, for example, a moving-coil type ammeter which indicates an average value of a current flowing therethrough and in the above-assumed case, it points the null center to indicate that the FM receiver is precisely tuned.

If the tuning of the FM receiver deviates from the receiving signal frequency, then a difference arises between the D.C. components of the input voltages at the first and second audio signal input terminals 1 and 2, and thereby the FM signal processing circuit is deviated from the above-described balanced state. For instance, if the tuning is deviated in such a manner that the D.C. component of the input voltage at the first audio signal input terminal 1 may become higher than the D.C. component of the input voltage at the second signal input terminal 2, then the D.C. component of the current flowing through the transistor 3 is increased, and on the other hand the D.C. component of the current flowing through the transistor 4 is decreased by the amount equal to the increment. Consequently, the DC component of the current flowing from the collector of the transistor 4 to the input point 18 of the current mirror circuit 17 via the transistor 9 is decreased, so that the D.C. component of the current derived from the second output point 24 of the current mirror circuit 17 is also decreased. Since the currents in the current mirror circuit 15 are not varied, a current corresponding to the sum of the increment of the D.C. component of the current flowing through the transistor 3 and the decrement of the D.C. component of the current flowing through the second output point 24 of the current mirror circuit 17 appears as a D.C. component of a current flowing to the tuning signal output terminal 25. The direction of the D.C. component of the current in this case is the direction flowing from the bias terminal 28 through the resistor 27 and the null-centered tuning indicator 26 to the tuning signal output terminal 25. In this way, a D.C. component appears in the current flowing through the null-centered tuning indicator 26, and hence the null-centered tuning indicator 26 is driven so as to deviate from the null center point indicating that the tuning of the FM receiver is not correctly achieved. On the contrary, in the case where the tuning of the FM receiver has been deviated from the received signal frequency so that the input voltage at the first audio signal input terminal 1 becomes lower than the input voltage at the second audio signal input terminal 2, then likewise a D.C. component in the opposite direction appears in the current flowing through the null-centered tuning indicator 26, and thereby the null-centered tuning indicator 26 is driven so as to deviate the opposite direction. In this manner, the D.C. component of the current flowing through the null-centered tuning indicator 26 will vary depending upon the value and direction of the deviation in tuning of the FM receiver. The signal component of the current flowing through this null-centered tuning indicator 26 is removed as by-passed via the capacitor 29 to the ground, and only the D.C. component of the current is detected as a voltage drop by the resistor 27. The voltage detected in this way is derived as an AFC voltage from the terminal 31 via the resistor 30, and also the absolute value of the voltage is detected by the tuning detection circuit 32 and is derived from the output of the tuning detection circuit 32 to be used as a band muting control signal of the FM receiver. In this way a center frequency deviation detector circuit is composed of the resistor 27, the capacitor 29 and the tuning detection circuit 32.

In the case where an output is not derived from the FM receiver under muting control, the control input voltage at the second current switching control signal input terminal 14 is made higher than the control input voltage at the first current switching control signal input terminal 13, and thereby the transistors 8 and 11 are made conducting so as to operate in a grounded base mode, while the transistors 9 and 10 are cut off. Consequently, the current supplied from the current source 12 is applied to the input point 18 of the current mirror circuit 17 via the transistor 11, so that the output current derived from the first output point 19 of the current mirror circuit 17 contains only a D.C. component. Since the value of the output current is identical to that in the case of not subjecting the FM receiver to muting control where the input voltages at the first and second audio signal input terminals 1 and 2 are equal to each other, the shock noise appearing at the output when the muting signal is applied to or released from the FM receiver can be reduced.

The signal applied between the input terminals 1 and 2 is amplified by the transistors 3 and 4, and the current flowing from the transistor 4 is switched to the current mirror circuit 15 at the muting operation or to the current mirror circuit 17 to derive an output from the output terminal 20 in non-muting operation.

As described previously, since the ratio of the current flowing through the input point 16 of the current mirror circuit 15 to the current flowing through its output point 23 and the ratio of the current flowing through the input point 18 of the current mirror circuit 17 to the current flowing through its second output point 24 are both preset at 1:½, even if the input points 16 and 18 of the current mirror circuits 15 and 17, respectively, are interchanged by switching, there occurs no change in the operation of deriving a current through the common connection of the output point 23 of the current mirror circuit 15 and the second output point 24 of the current mirror circuit 17. With regard to the other operations also, the FM receiver operates in a similar manner to the case of deriving an output without applying muting action to the FM receiver. This results in a very small shock noise at muting change.

As described above, according to the above preferred embodiment of the invention, an audio frequency amplifier circuit, a current switching circuit, a tuning indicator drive circuit, an AFC voltage detector circuit and a center frequency deviation detector circuit can be composed in a single circuit block with a simple construction, and therefore, the present invention has an advantage that the entire construction of an FM receiver can be simplified. In addition, since a control signal for band muting is derived by directly detecting a D.C. component of a current flowing through a null-centered tuning indicator 26, the null center point of the null-centered tuning indicator 26 and the center of the band muting coincide with each other. Furthermore, conventional precise tuning as shown in U.S. Pat. No. 3,673,499, for example, was made by reference to the signal strength indicator and the listener searched an optimum tuning point by manual operation. It was difficult for the listener, however, to obtain a precise tuning point, because the precise tuning was at the peak signal strength which the listener did not know until the tuning frequency was passed. And a long term was required until the listener obtained the optimum tuning point. However, the present invention has the null-centered tuning indicator teaching a precise tuning point by a null-centered point, and therefore the listener can find the precise tuning point rapidly and precisely. Also there is an advantage that the shock noise upon applying or releasing the muting control can be reduced. Furthermore, there is an additional advantage that the circuit construction according to the present invention can be easily constructed in an integrated circuit.

According to modified embodiments of the present invention it is possible to regulate the detection sensitivity for an AFC voltage or to preset upper and lower limits of an AFC voltage.

Figure 2:
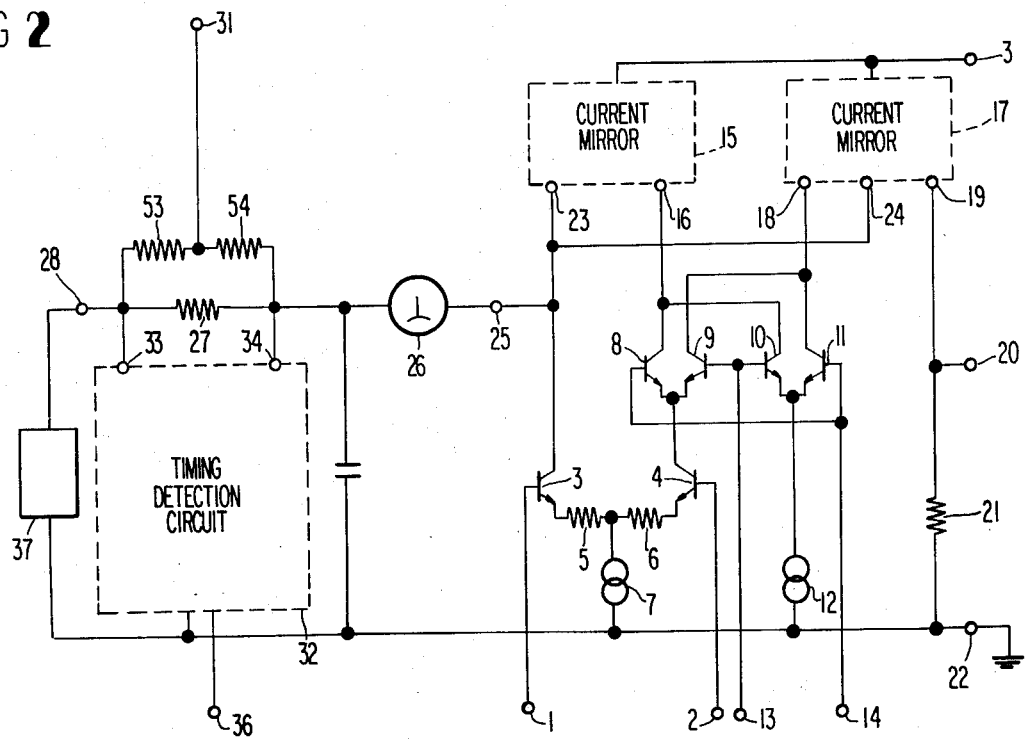
FIG. 2 is a circuit diagram showing another preferred embodiment of the present invention.

In FIG. 2 is shown one example of the modified embodiments. This circuit is different from the circuit shown in FIG. 1 only in that serially connected resistors 53 and 54 are connected in parallel to a resistor 27 and an AFC voltage is derived from the junction point between the resistors 53 and 54, the remainder of the circuit being indentical to that in FIG. 1, and the operations are also similar to those of the circuit in FIG. 1. According to this modified embodiment, the detection sensitivity for an AFC voltage can be lowered, to a preferable level by selecting the resistance of the resistors 53 and 54 without any affect on the other operations.

Figure 3:
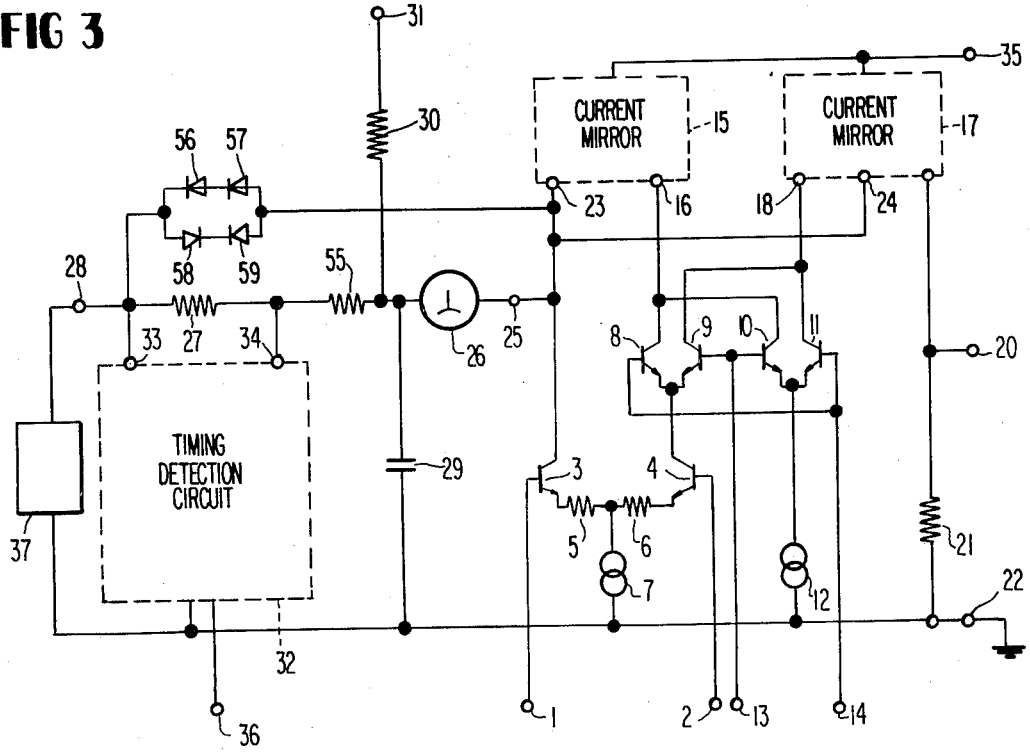
FIG. 3 is a circuit diagram showing still another preferred embodiment of the present invention.

FIG. 3 shows another modified embodiment. This circuit is different from the circuit shown in FIG. 1 only in that an additional resistor 55 is connected between a resistor 27 and a null-centered tuning indicator 26, that between a bias terminal 28 and a tuning signal output terminal 25 are connected serially connected diodes 56 and 57 and further serially connected diodes 58 and 59 which are connected in parallel to the diodes 56 and 57 and in the opposite polarity to the diodes 56 and 57, and that an AFC voltage is derived from the junction point between the resistor 55 and the null-centered tuning indicator 26. The remainder of the circuit being identical to that in FIG. 1, and the operations are also similar to those of the circuit in FIG. 1. In this modified embodiment, a detection sensitivity for an AFC voltage is raised by means of the resistor 55, and by making use of the diodes 56, 57 and the diodes 58, 59, upper and lower limits are preset for the variation range of the AFC voltage so that the transistor 3 or the output transistors in the current mirror circuit 15 and 17 may not be saturated.

It is apparent for the skilled in the art, if the band muting function is not necessary, the tuning detection circuit 32 may be removed from the circuit blocks of the embodiments shown. Further, if the AFC operation is not required, the resistors 30, 53 and 54 and capacitor 29 can be omitted. However, even in this case, it is preferable to retain the capacitor 29 for reliable operation of the null-centered tuning indicator 26.

What is claimed is:

1. A signal processing circuit comprising: an amplifier circuit receiving first and second demodulated signals of the frequency modulated signal and deriving first and second output signals, a first current source producing a first constant current, a current switching circuit having a first input point receiving said second output signal, a second input point receiving said first constant current, first and second output points and a switching control input means, said current switching curcuit switching current paths from said first and second input points to said first and second output points in response to signal applied to said switching control input means, a first current mirror having an input point coupled to said second output point of said current switching circuit and an output point coupled to said first output signal of said amplifier circuit, a second current mirror having an input point coupled to said first output point of said current switching circuit, a first output point coupled to said output point of said first current mirror, and a second output point coupled to an output terminal for deriving an output signal of said signal processing circuit, a reference voltage terminal and a null-centered indicator connected between said reference voltage terminal and connection means between said output point of said first current mirror and said first output point of said second current mirror.

2. A signal processing circuit as claimed in claim 1, wherein said amplifier circuit comprises a differential amplifier of first and second transistors, base terminals of said first and second transistors receiving said first and second demodulated signals, respectively, emitter terminals of said first and second transistors being coupled to a second current source, a collector of said first transistor being coupled to said output point of said first current mirror, and a collector of said second transistor being coupled to said first input point of said current switching circuit.

3. A signal processing circuit as claimed in claim 1, wherein said current switching circuit comprises third, fourth, fifth and sixth transistors, emitters of said third and fourth transistors being connected to said first input point of said current switching circuit to receive said second output from said first amplifier circuit, emitters of said fifth and sixth transistors being connected to said second input of said current switching circuit to receive said first constant current from said first current source, collectors of said fourth and sixth transistors being connected to said first output point of said current switching circuit, and collectors of said third and fifth transistors being connected to said second output point of said current switching circuit.

4. A signal processing circuit as claimed in claim 1, wherein said first current mirror comprises a first diode and a seventh transistor, said first diode being connected between base and emitter of said seventh transistor, the junction point of said first diode and said base of said seventh transistor being connected to said input point of said first current mirror, and a collector of said seventh transistor being connected to said output point of said first current mirror.

5. A signal processing circuit as claimed in claim 1, wherein said second current mirror comprises a second diode, eighth and ninth transistors, said second diode being connected between the bases and emitters of said eighth and ninth transistors, said input point of said second current mirror being connected to the junction point of said second diode and said bases of said eighth and ninth transistors, and said first and second output points of said second current mirror being connected to collectors of said eighth and ninth transistors, respectively.

6. A signal processing circuit as claimed in claim 1, 2, 3, 4 or 5, further comprising a potential difference detector circuit inserted between said reference voltage terminal and said null-centered indicator.

7. A signal processing circuit comprising an amplifier circuit including a differential amplifier of first and second transistors, third and fourth transistors having their emitters connected in common, fifth and sixth transistors having their emitters connected in common, input signals being applied to the respective bases of the first and second transistors in said amplifier circuit, the emitters of said first and second transistors being coupled to a first current source, the collector of said second transistor being connected to the common emitters of said third and fourth transistors, the base of said third transistor and the base of said sixth transistor being connected in common to be used as a first current switching control input terminal, the base of said fourth transistor and the base of said fifth transistor being connected in common to be used as a second current switching control input terminal, the common emitter of said fifth and sixth transistors being connected to a second current source, a first current mirror circuit responsive to a current flowing through its input terminal for outputting a current proportional to the input current from its output terminal, a second current mirror circuit responsive to a current flowing through its input terminal for outputting first and second currents each proportional to the input current from its first and second output terminals, the collectors of said third and fifth transistors being connected in common to the input terminal of said first current mirror circuit, the collectors of said fourth and sixth transistors being connected in common to the input terminal of said second current mirror circuit, an output signal being derived from the first output terminal of said second current mirror circuit, the output terminal of said first current mirror circuit, said second output terminal of said second current mirror circuit and the collector of said first transistor being connected in common, a reference voltage terminal, and a null-centered tuning indicator connected between the last said common junction and said reference voltage terminal.

* * * * *

UNITED STATES PATENT AND TRADEMARK OFFICE
CERTIFICATE OF CORRECTION

PATENT NO. : 4,219,778
DATED : August 26, 1980
INVENTOR(S) : Eiichi Ishii

It is certified that error appears in the above—identified patent and that said Letters Patent is hereby corrected as shown below:

Column 1, line 10, delete "information" and insert -- formation --

Column 3, line 37, after "terminal" delete "38" and insert -- 35 --

Column 4, line 32, delete "output" and insert -- input --

Column 5, line 61, after "deviate" insert -- in --

Signed and Sealed this

Third Day of February 1981

[SEAL]

Attest:

RENE D. TEGTMEYER

Attesting Officer
Acting Commissioner of Patents and Trademarks